United States Patent
Makala et al.

(10) Patent No.: US 9,093,321 B2
(45) Date of Patent: *Jul. 28, 2015

(54) THREE DIMENSIONAL NAND DEVICE AND METHOD OF CHARGE TRAP LAYER SEPARATION AND FLOATING GATE FORMATION IN THE NAND DEVICE

(71) Applicant: SANDISK TECHNOLOGIES INC., Plano, TX (US)

(72) Inventors: Raghuveer S. Makala, Sunnyvale, CA (US); Johann Alsmeier, San Jose, CA (US); Yao-Sheng Lee, Tampa, FL (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,671

(22) Filed: Nov. 18, 2014

(65) Prior Publication Data

US 2015/0069494 A1    Mar. 12, 2015

Related U.S. Application Data

(60) Continuation of application No. 14/166,162, filed on Jan. 28, 2014, now Pat. No. 8,933,501, which is a division of application No. 13/544,328, filed on Jul. 9, 2012, now Pat. No. 8,658,499.

(51) Int. Cl.
*H01L 27/115*    (2006.01)
*H01L 21/28*    (2006.01)
(Continued)

(52) U.S. Cl.
CPC .... *H01L 27/11582* (2013.01); *H01L 21/28273* (2013.01); *H01L 21/28282* (2013.01); *H01L 21/7682* (2013.01); *H01L 27/11529* (2013.01); *H01L 27/11551* (2013.01); *H01L 27/11556* (2013.01); *H01L 27/11573* (2013.01);
(Continued)

(58) Field of Classification Search
USPC .............. 257/316, 314, 324, E21.422, E29.3, 257/E29.309
See application file for complete search history.

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

WO    WO02/15277 A1    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Mamadou Diallo
(74) *Attorney, Agent, or Firm* — The Marbury Law Group PLLC

(57) ABSTRACT

A monolithic three dimensional NAND string includes a vertical semiconductor channel and a plurality of control gate electrodes in different device levels. The string also includes a blocking dielectric layer, a charge storage region and a tunnel dielectric. A first control gate electrode is separated from a second control gate electrode by an air gap located between the major surfaces of the first and second control gate electrodes and/or the charge storage region includes silicide nanoparticles embedded in a charge storage dielectric.

20 Claims, 13 Drawing Sheets

(51) Int. Cl.
*H01L 29/788* (2006.01)
*H01L 29/792* (2006.01)
*H01L 21/768* (2006.01)

(52) U.S. Cl.
CPC ...... *H01L27/11578* (2013.01); *H01L 29/7889* (2013.01); *H01L 29/7926* (2013.01)

(56) References Cited

U.S. PATENT DOCUMENTS

| | | |
|---|---|---|
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,658,499 B2 | 2/2014 | Makala et al. |
| 2007/0210338 A1 | 9/2007 | Orlowski |
| 2007/0252201 A1 | 11/2007 | Kito et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0198687 A1 | 8/2011 | Lee |
| 2011/0266606 A1 | 11/2011 | Park et al. |
| 2011/0280077 A1 | 11/2011 | Fishburn |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0092926 A1 | 4/2012 | Whang |
| 2012/0146122 A1 | 6/2012 | Whang et al. |
| 2013/0264631 A1 | 10/2013 | Alsmeier et al. |
| 2013/0313627 A1 | 11/2013 | Lee et al. |
| 2014/0138760 A1 | 5/2014 | Makala et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6 pgs.

International Search Report and Written Opinion, International Application No. PCT/US2011/042566, issued Jan. 17, 2012.

Invitation to Pay Additional Fees & Partial International Search Report, PCT/US2011/042566, issued Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Preliminary Report on Patentability received in connection with international application No. PCT/US2013/048508; mailed Jan. 22, 2015.

International Search Report and Written Opinion received in connection with international application No. PCT/US2013/048508; mailed Dec. 18, 2013.

Chen Y. T. et al., "Formation of $NiSi_2/SiN_x$ compound nanocrystal for nonvolatile memory application", Thin Solid Films, Elsevier-Sequoia S.A., Lausanne, Switzerland, vol. 518, No. 24, pp. 7324-7327 (2010).

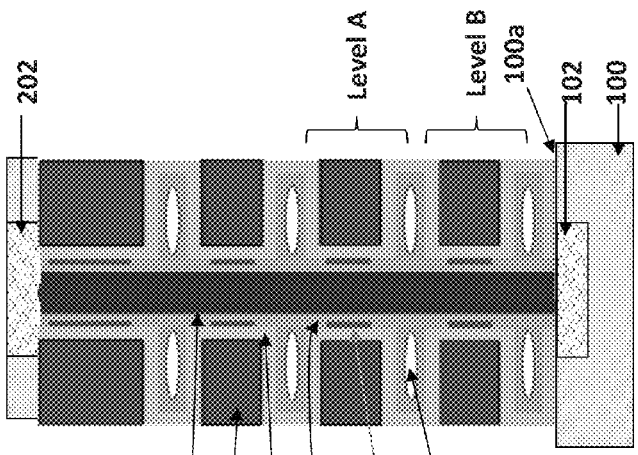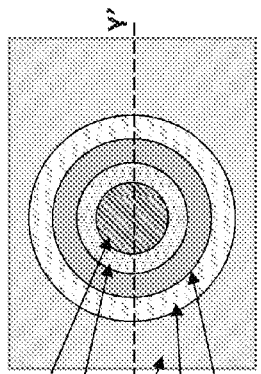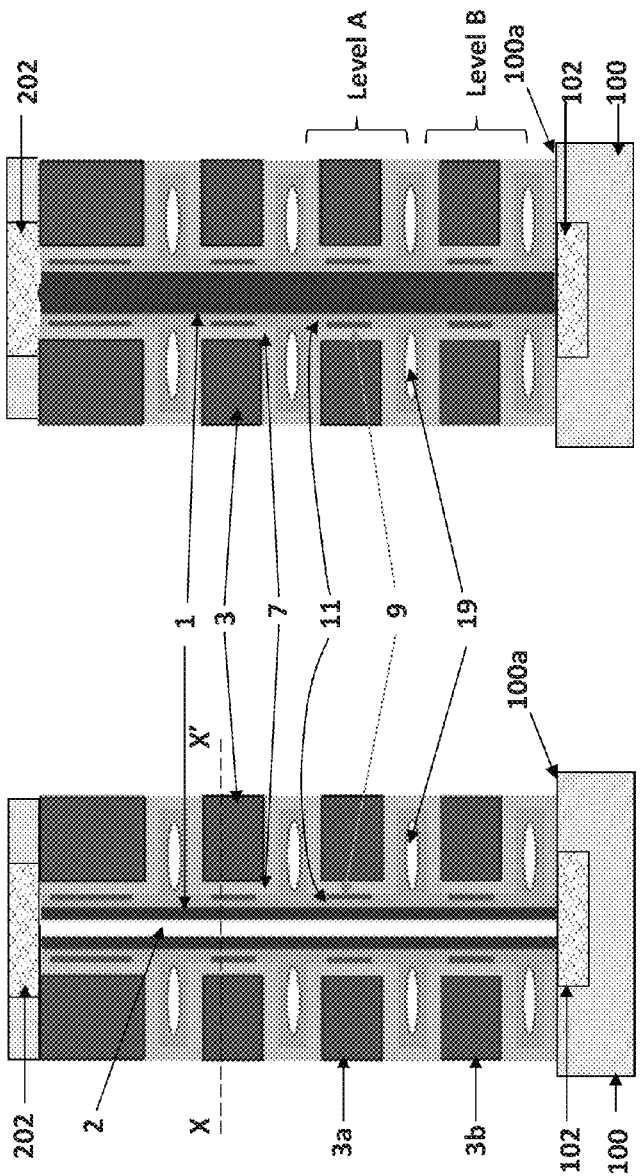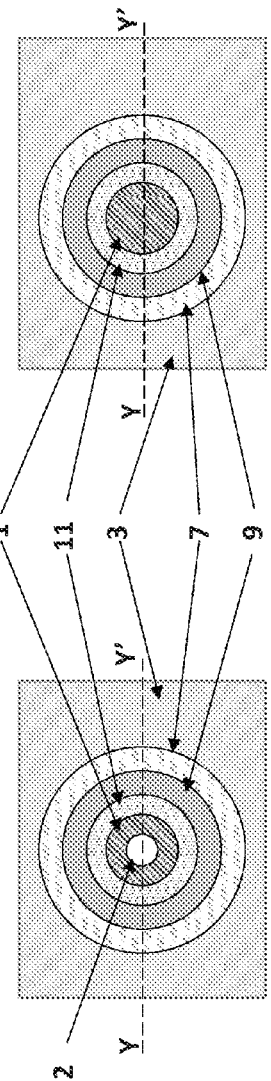

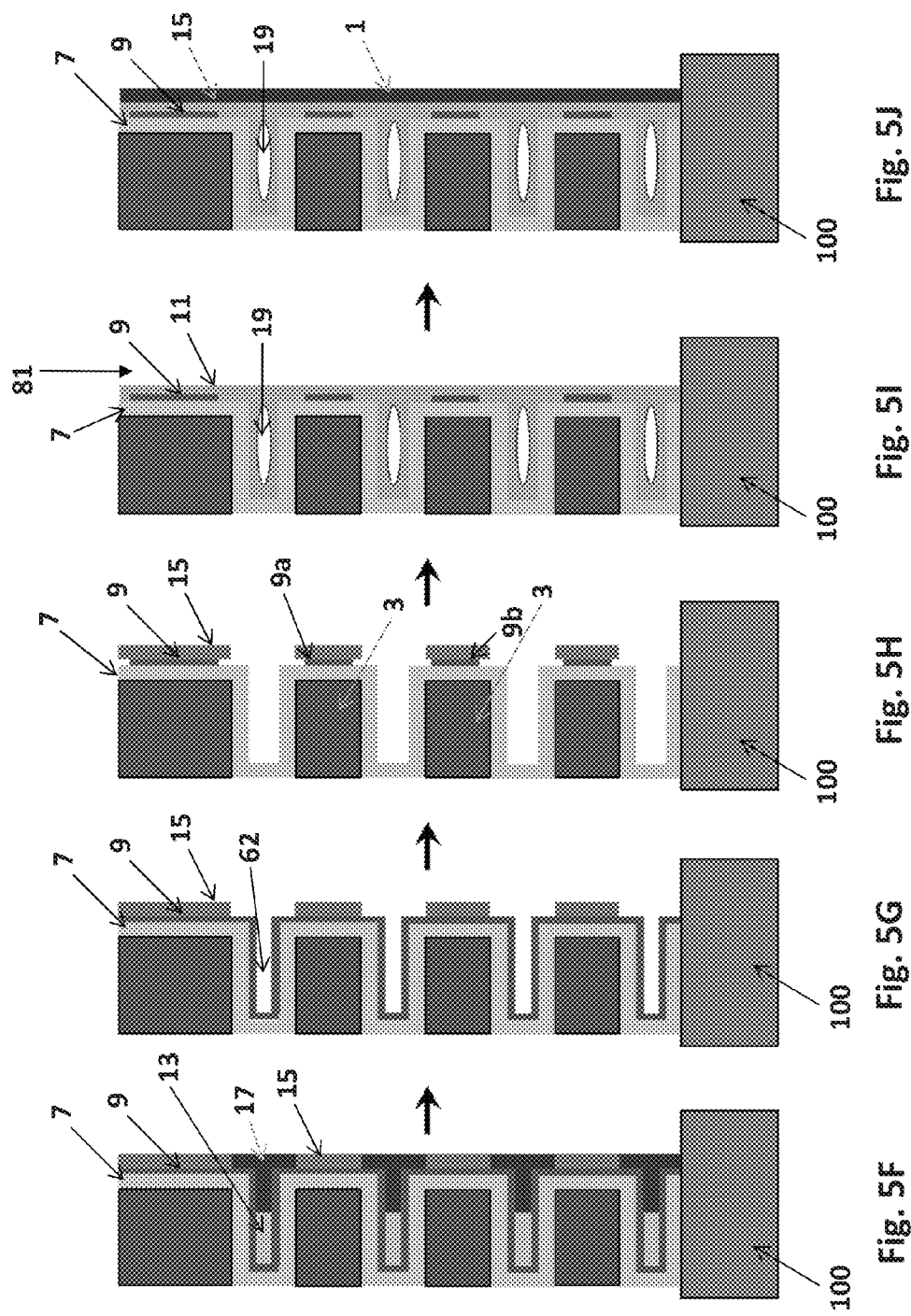

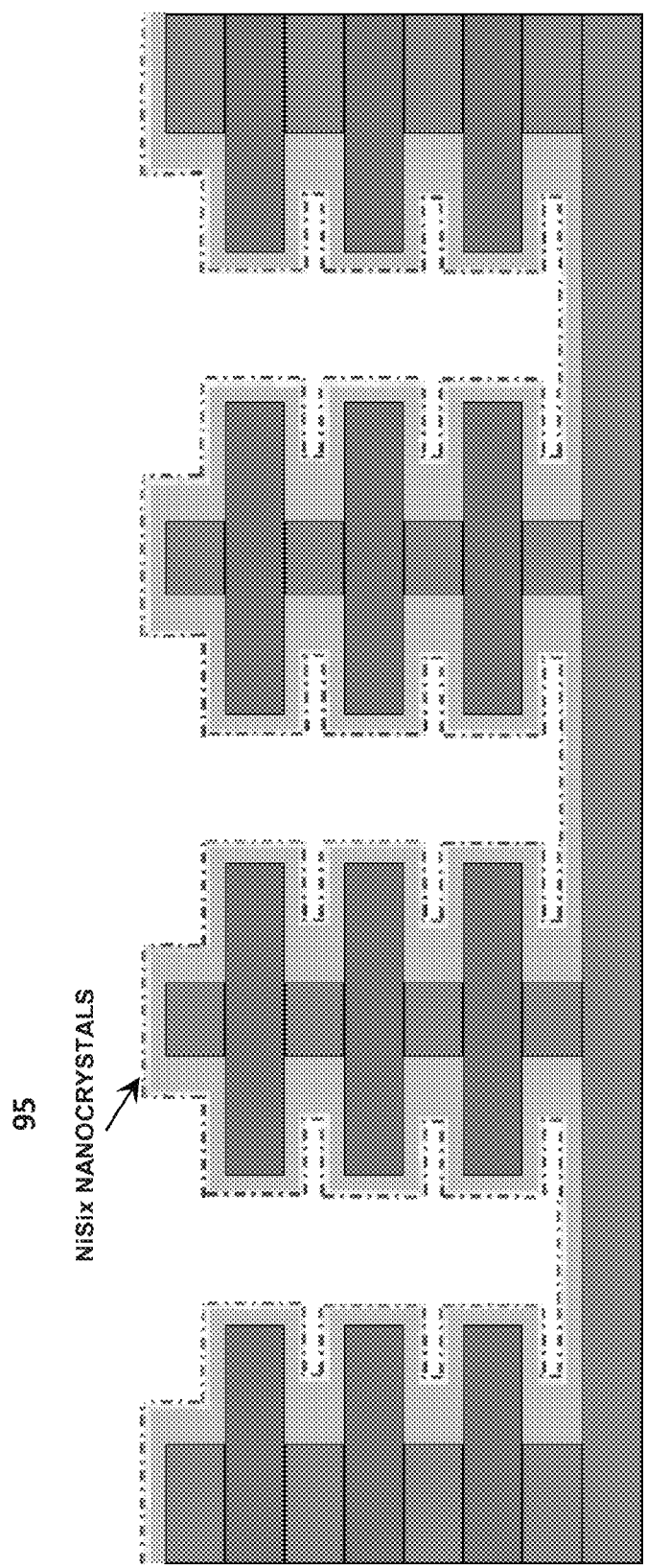

THREE DIMENSIONAL NAND DEVICE AND METHOD OF CHARGE TRAP LAYER SEPARATION AND FLOATING GATE FORMATION IN THE NAND DEVICE

RELATED APPLICATIONS

The instant application is a continuation application of U.S. application Ser. No. 14/166,162 filed on Jan. 28, 2014, which is a divisional application of U.S. application Ser. No. 13/544,328 filed on Jul. 9, 2012, the entire contents of which are incorporated herein by reference.

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a device including forming a stack of alternating layers of a first material and a second material over a substrate. The first material includes a conductive or semiconductor control gate material and the second material includes a first sacrificial material. The method also includes etching the stack to form an opening in the stack, selectively removing the second material through the opening to form recesses, forming a blocking dielectric layer in the recesses to partially fill the recesses, the blocking dielectric layer located on surfaces of the control gate material and forming a charge storage material layer over the blocking dielectric such that the charge storage material layer partially fills the recesses and is located over the blocking dielectric layer. The method also includes filling the recesses with a second sacrificial material, at least partially filling the opening with a third sacrificial material, such that the third sacrificial material contacts the second sacrificial material and reacting the second and third sacrificial materials to form a sacrificial compound material comprising the second and third sacrificial materials where the second and third sacrificial material layers contact each other. The method also includes, selectively removing the sacrificial compound material and any second sacrificial material remaining in the recesses while leaving unreacted portions of the third sacrificial material located adjacent to vertical edges of the control gate material and selectively removing portions of the charge storage material layer located in the recesses that are not covered by the unreacted portion of third sacrificial material located over the vertical edges of the control gate material, thereby forming vertically separated charge storage segments over the vertical edges of the control gate material.

Another embodiment relates to a monolithic three dimensional NAND string including a semiconductor channel, at least one end portion of the semiconductor channel extending substantially perpendicular to a major surface of a substrate. The string also includes a plurality of control gate electrodes having a strip shape with major surfaces extending substantially parallel to the major surface of the substrate. The plurality of control gate electrodes include at least a first control gate electrode located in a first device level and a second control gate electrode located in a second device level located over the major surface of the substrate and below the first device level. The first control gate electrode is separated from the second control gate electrode by an air gap located substantially between the major surfaces of the first and second control gate electrodes. The string also includes a blocking dielectric layer located in contact with the plurality of control gate electrodes and a plurality of spaced apart charge storage segments. The plurality of spaced apart charge storage segments include at least a first spaced apart charge storage segment located in the first device level and a second spaced apart charge storage segment located in the second device level. The string also includes a tunnel dielectric layer located between each one of the plurality of the spaced apart charge storage segments and the semiconductor channel.

Another embodiment relates to a monolithic three dimensional NAND string including a semiconductor channel, at least one end portion of the semiconductor channel extending substantially perpendicular to a major surface of a substrate and a plurality of control gate electrodes having a strip shape with major surfaces extending substantially parallel to the major surface of the substrate. The plurality of control gate electrodes comprise at least a first control gate electrode located in a first device level and a second control gate electrode located in a second device level located over the major surface of the substrate and below the first device level. The string also includes a blocking dielectric layer located in contact with the plurality of control gate electrodes, a charge storage region comprising metal silicide nanoparticles embedded in a charge storage dielectric matrix, and a tunnel dielectric layer located between the charge storage region and the semiconductor channel.

Another embodiment relates to a method of making a vertical, monolithic three dimensional NAND string, comprising forming a stack of alternating layers of a first material and a second material over a substrate, wherein the first material comprises a conductive or semiconductor control gate material, etching the stack to form an opening in the stack, forming a blocking dielectric layer in the opening, the blocking dielectric layer located on surfaces of the control gate material, forming a charge storage region comprising metal silicide nanoparticles embedded in a charge storage dielectric matrix in the opening over the blocking dielectric layer, forming a tunnel dielectric layer in the opening, and forming a semiconductor channel layer in the opening over the tunnel dielectric layer.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 5A-5J, 6 and 7A-7B are side cross sectional views illustrating embodiments of methods of making the NAND strings illustrated in FIGS. 1-4.

FIGS. 8A-8G are side cross sectional views illustrating alternative embodiments of methods of making vertical NAND strings.

DETAILED DESCRIPTION

The embodiments of the invention provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
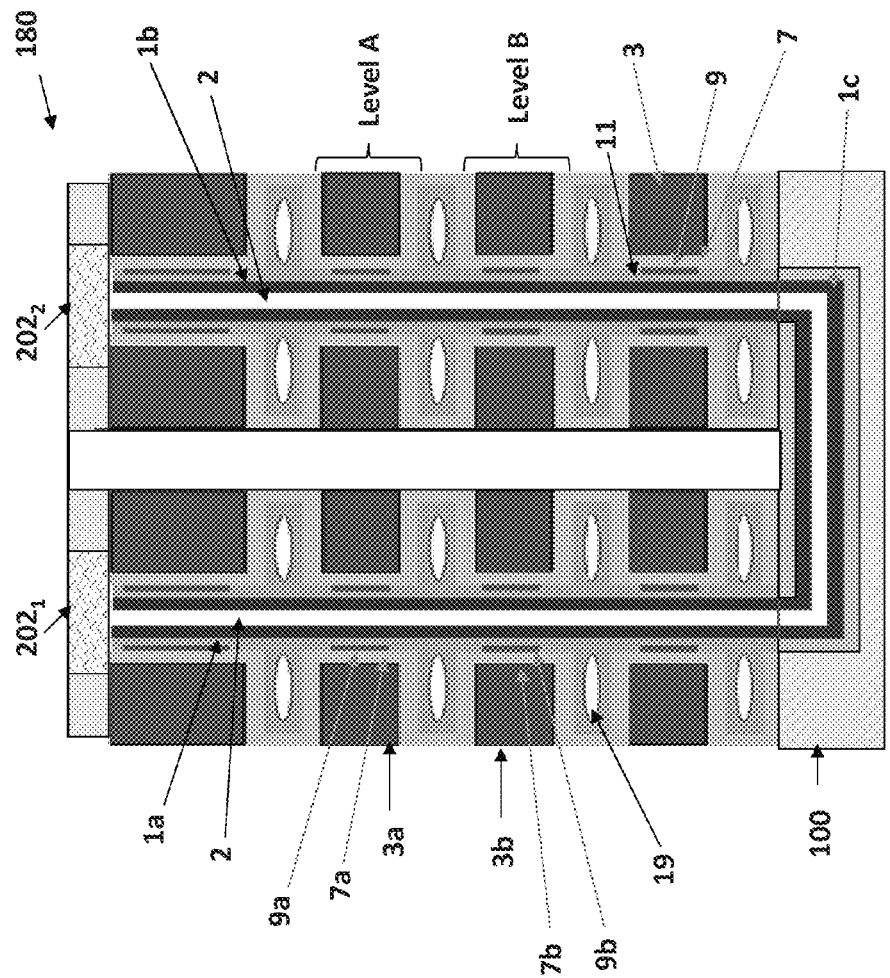
FIG. 3 is side cross sectional view of a NAND string of an embodiment with a U-shaped channel.
Figure 4:
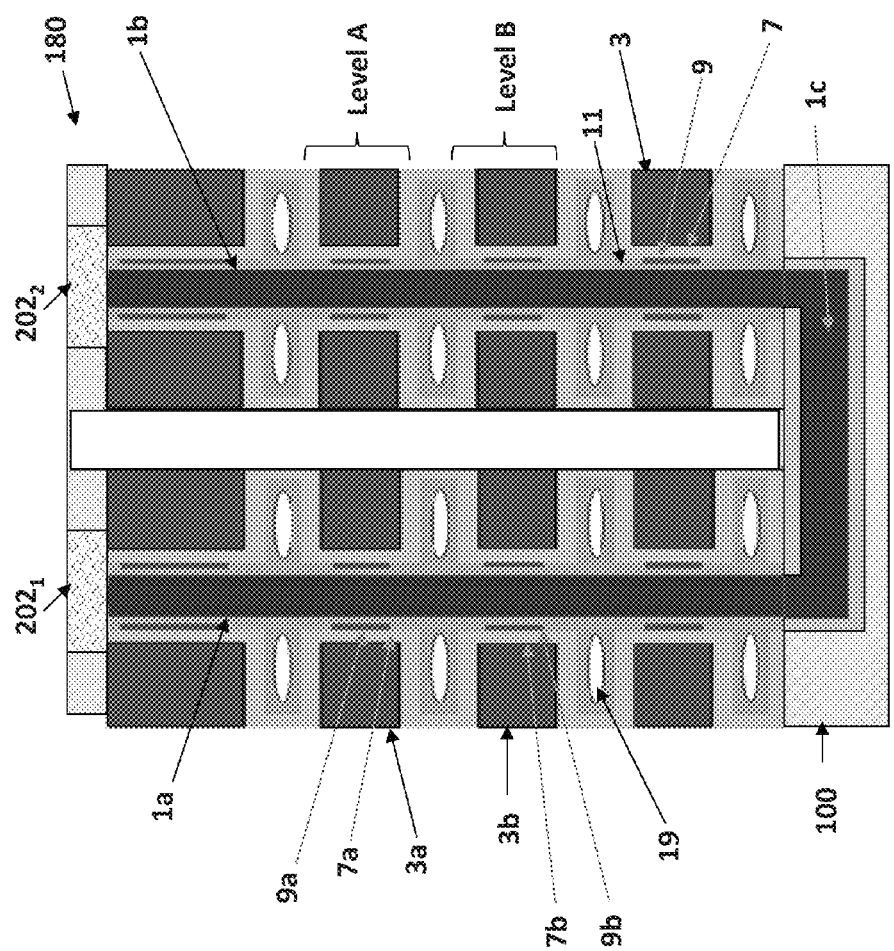
FIG. 4 is side cross sectional view of a NAND string of another embodiment with a U-shaped channel.

In some embodiments, the monolithic three dimensional NAND string 180 comprises a semiconductor channel 1 having at least one end portion extending substantially perpendicular to a major surface 100a of a substrate 100, as shown in FIGS. 1A and 2A. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIGS. 3 and 4. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially perpendicular to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel from above. An optional body contact electrode (not shown) may be disposed in the substrate 100 to provide body contact to the connecting portion of the semiconductor channel 1 from below. The NAND string's select or access transistors are not shown in FIGS. 1-4 for clarity.

In some embodiments, the semiconductor channel 1 may be a filled feature, as shown in FIGS. 2A-2B and 4. In some other embodiments, the semiconductor channel 1 may be hollow, for example a hollow cylinder filled with an insulating fill material 2, as shown in FIGS. 1A-1B and 3. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3-4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to the control gate(s) 3 and may surround the control gate 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 3 and 4.

The monolithic three dimensional NAND string also comprise a plurality of discrete charge storage segments 9 located between the blocking dielectric 7 and the channel 1. Similarly, the plurality of discrete charge storage segments 9 comprise at least a first discrete charge storage segment 9a located in the device level A and a second discrete charge storage segment 9b located in the device level B, as shown in FIGS. 3 and 4.

The tunnel dielectric 11 of the monolithic three dimensional NAND string is located between each one of the plurality of the discrete charge storage segments 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other high-k insulating materials. The blocking dielectric 7 and/or the tunnel dielectric 11 may include multiple layers of silicon oxide, silicon nitride and/or silicon oxynitride (e.g., ONO layers).

The discrete charge storage segments 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete charge storage dielectric (e.g., silicon nitride or another dielectric) feature. For example, in some embodiments, the discrete charge storage segments 9 are discrete charge storage dielectric features, each of which comprises a nitride feature adjacent the respective blocking dielectric 7, where the silicon oxide blocking dielectric 7, the nitride feature 9 and the silicon oxide tunnel dielectric 11 form oxide-nitride-oxide discrete charge storage structures of the NAND string.

FIGS. 5A-5J illustrate a method of making a NAND string according to a first embodiment of the invention.

Figure 5E:
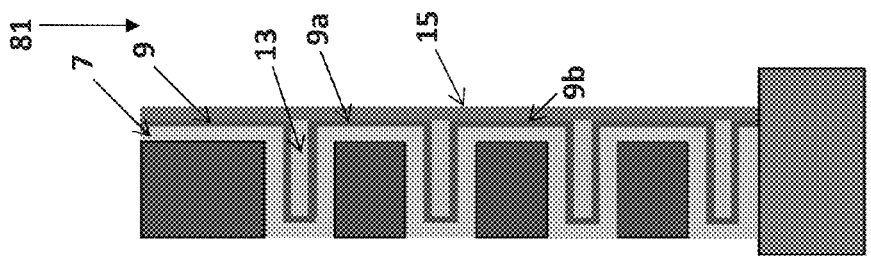
Figure 5D:
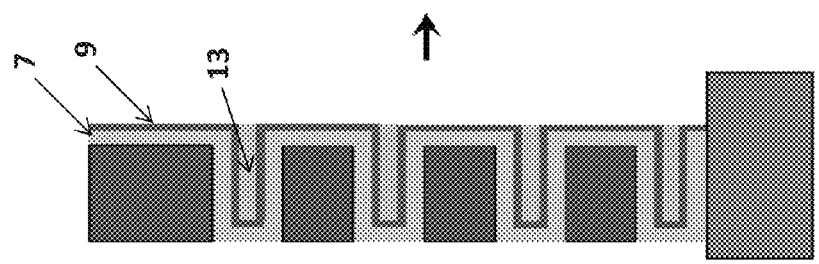
Figure 5C:
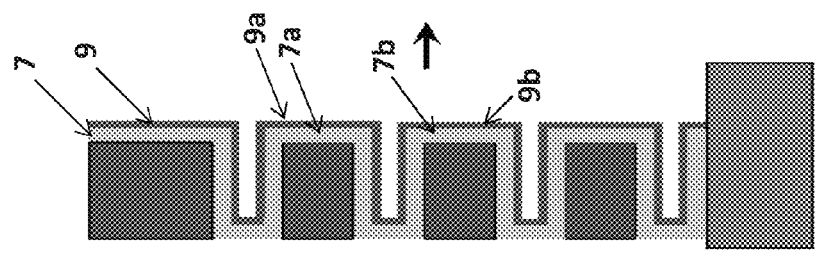
Figure 5B:
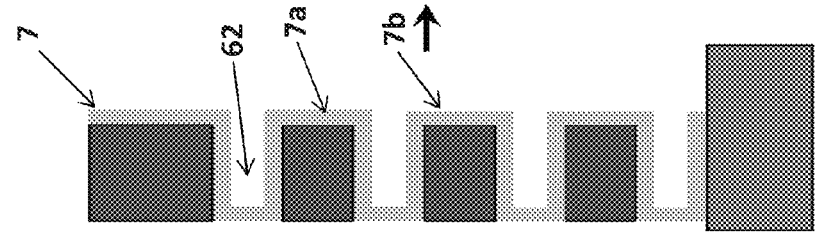
Figure 5A:
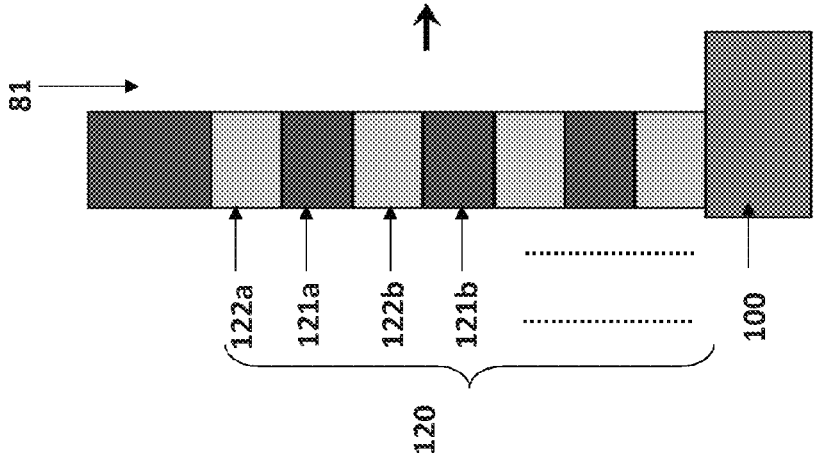

Referring to FIG. 5A, a stack 120 of alternating layers 121 (121a, 121b, etc.) and 122 (122a, 122b etc.) are formed over the major surface of the substrate 100. Layers 121, 122 may be deposited over the substrate by any suitable deposition method, such as sputtering, CVD, MBE, etc. The layers 121, 122 may be 6 to 100 nm thick.

In this embodiment, the first layers 121 comprise a first conductive (e.g., metal or metal alloy) or semiconductor (e.g., heavily doped n+ or p+ polysilicon) control gate material, and the second layers 122 comprise a first sacrificial material, such as intrinsic polysilicon or an insulating material (e.g., silicon nitride, silicon oxide, etc.). The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

The deposition of layers 121, 122 is followed by etching the stack 120 to form at least one opening 81 in the stack 120. An array of openings 81 may be formed in locations where vertical channels of NAND strings will be subsequently formed.

Next, the second material 122 is selectively etched compared to the first material 121 to form first recesses 62 in the second material 122 (i.e., layers 122a, 122b, etc). The recesses 62 may be formed by selective, isotropic wet or dry etching which selectively etches the second material 122 compared to the first material 121. The depth of each recess 62 may be 6 to 100 nm.

A blocking dielectric 7 (also known as an inter-poly dielectric, IPD) is then formed in the openings 81 such that the blocking dielectric coats the sides of the first recesses 62, resulting in a structure as shown in FIG. 5B. The blocking dielectric 7 may comprise a silicon oxide layer deposited by conformal atomic layer deposition (ALD) or chemical vapor deposition (CVD). Other high-k dielectric materials, such as hafnium oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. The blocking dielectric 7 comprises a plurality of discrete blocking dielectric segments (e.g., 7a and 7b). The blocking dielectric segments 7a and 7b are connected to each other by clam-shaped portions of the charge blocking dielectric layer 7 which extend inside the recesses 62.

As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open. The opening may be filled by another material or layer.

A charge storage material 9 is formed in the openings 81 and in the first recesses 62 over the blocking dielectric material 7, resulting in the structure shown in FIG. 5C. The charge storage material 9 comprises a plurality of charge storage segments (e.g., 9a and 9b) formed between openings in a respective one of the plurality of clam-shaped blocking dielectric segments (e.g., 7a or 7b). The charge storage segments 9a, 9b are connected to each other by portions of the charge storage material 9 layer which extend inside the recesses 62.

As explained above, in some embodiments, the charge storage material 9 may comprise a charge storage dielectric material (e.g., silicon nitride). Alternatively, the discrete charge storage material may comprise a conductive or semiconductor floating gate material (e.g., a metal, metal alloy such as TiN, metal silicide, or heavily doped polysilicon floating gate material). Any desired methods may be used to form the charge storage material 9, such as ALD or CVD.

In the next step of this embodiment of the method, illustrated in FIG. 5D, a second sacrificial layer 13 is deposited in the clam shaped portion of the charge storage material 9 layer which extends inside the recesses 62. Preferably, the second sacrificial layer completely fills the clam shaped portion of the charge storage material layer 9 in the recesses 62. The second sacrificial material 13 may be a metal (e.g. titanium, nickel or cobalt) that can form a silicide (e.g. titanium, nickel or cobalt silicide) or a semiconducting material that forms a semiconducting alloy (e.g., Ge which may be alloyed with Si or C to form SiGe or GeC) that may be selectively etched relative to the metal or constituent semiconducting elements. The second sacrificial material 13 may be formed by filling the openings 81 and the recesses 62 with the second sacrificial material 13, followed by anisotropic etching to remove the exposed second sacrificial material 13 from the openings 81 such that material 13 remains in the recesses 62.

Next, as illustrated in FIG. 5E, a third sacrificial layer 15 is deposited in the opening 81. The third sacrificial layer 15 covers the charge storage segments 9a, 9b and contacts the second sacrificial material 13 located in the clam shaped portion of the charge storage material layer 9 in recesses 62.

As illustrated in FIG. 5F, the second and third sacrificial materials 13, 15 are then reacted to form a sacrificial compound material 17. The sacrificial compound material 17 is formed where the second and third sacrificial material layers 13, 15 contact each other. For example, if the second sacrificial material 13 is germanium and the third sacrificial material 15 is silicon, these materials can be reacted, such as by heating, to form a silicon-germanium alloy. In an embodiment, the NAND strings have a circular cross section as viewed from the top (FIGS. 1B, 2B). The sacrificial compound material 17 may forms SiGe rings around the opening 81. Alternatively, if the second sacrificial material 13 is a metal such as titanium, cobalt or nickel, and the third sacrificial material 15 is silicon, then the second and third sacrificial materials 13, 15 may be heated to form titanium silicide, cobalt silicide or nickel silicide, respectively. The heating may be any suitable heating, such as rapid thermal annealing at a temperature between 700 and 1100 C, such as 900-1000 C.

Next, as illustrated in FIG. 5G, the sacrificial compound material 17 and any of the second sacrificial 13 material remaining in the recesses 62 is removed by selective etching. Unreacted portions of the third sacrificial material 15 located adjacent to vertical edges of the control gate material 3 and segments 9a, 9b, etc. are not removed. In an embodiment, the second sacrificial material 13 is germanium, the third sacrificial material 15 is silicon and the sacrificial compound material 17 is silicon-germanium. Silicon-germanium 17 may be selectively etched relative to silicon by wet etching with $HNO_3$:HF:$CH_3COOH$:$H_2O$, HF:$HNO_3$:$H_2O$, and/or HF:$NH_4F$:$H_2O_2$:$NH_4OH$. The germanium may be selectively etched relative to silicon nitride 9 by wet-etching with $H_2O_2$ or by reactive ion etching (RIE) with $BCl_3/Cl_2$ or $HBr/Br_2$.

As illustrated in FIG. 5H, the portions of the silicon nitride charge storage layer 9 located in the recesses 62 that are not covered by the unreacted portions of third sacrificial material 15 may be removed by selective etching. Silicon nitride may be selectively etched relative to silicon or silicon oxide by wet etching with hot $H_3PO_4$:$H_2O$ or dilute HF at high temperature. Alternatively, silicon nitride may be selectively etched relative to silicon or silicon oxide by RIE with $CH_xF_y$ based chemistries with x>1, y<3 with good selectivity to Si/$SiO_2$.

Additionally, portions of the charge storage layer 9 located over the vertical edges of the control gate material that are not covered by the unreacted (i.e., masking) portions of third sacrificial material 15 may be selectively removed, such that the charge storage segments do not extend into the recesses 62. However, those portions of the charge storage layer 9 that are covered by the unreacted third sacrificial material 15 are not etched. However, as illustrated in FIG. 5H, some undercut of the unreacted third sacrificial material 15 may occur. In this manner, vertically separated, discreet charge storage segments 9a, 9b may be formed over the vertical edges of the control gate material 3. Thus, selectively removing portions of the charge storage material (e.g., silicon nitride) layer 9 located in the recesses 62 that are not covered by the unreacted portions of the third sacrificial (e.g., polysilicon) material 15 forms silicon nitride 9/polysilicon 15 rings around the opening 81.

In the next step, unreacted portions of the third sacrificial (e.g., polysilicon) material 15 are removed, such as by etching, to expose the vertically separated, discreet charge storage segments 9a, 9b, as illustrated in FIG. 5I. Then, a tunnel dielectric material 11 is deposited in the recesses 62, over the charge storage segments 9a, 9b and in regions between the charge storage segments via the opening 81.

Optionally, in an embodiment, the tunnel dielectric material 11 may be deposited such that an air gap 19 is formed in the recess 62. This may be accomplished, for example by depositing the tunnel dielectric material 11 with a chemical vapor deposition (CVD) process to partially fill spaces in the recesses 62 to leave the air gaps 19 in the recesses between adjacent layers of control gate material 3. The use of an air gap in the recesses 62 reduces capacitance coupling between neighboring world lines in the NAND memory device. In those embodiments in which an air gap 19 is not desired, the tunnel dielectric material 11 may deposited, for example, with an atomic layer deposition (ALD) process, to completely fill the spaces in the recesses 62.

As illustrated in FIG. 5J, the channel may be formed by depositing channel material 1, such as a lightly doped or intrinsic polysilicon in the opening 81. As discussed above, the entire opening 81 may be filled to form the device illustrated in FIGS. 2A and 2B. Alternatively, a layer of channel material 1 may first be deposited in the opening 81 followed by deposition of an insulating fill material 2 to form the device illustrated in FIGS. 1A and 1B. If desired, the channel 1 may be U-shaped as illustrated in FIGS. 3 and 4.

Figure 6:
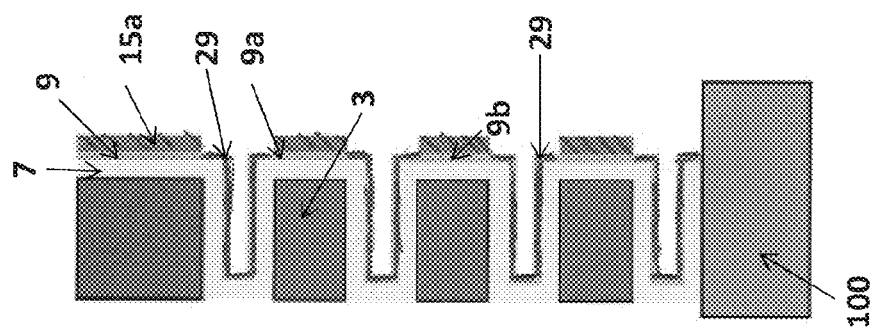

In an alternative second embodiment illustrated in FIG. 6, the third sacrificial material 15 may be oxidized after the step illustrated in FIG. 5G. That is, after removing the sacrificial compound 17 and the sacrificial material 13, the third sacrificial material 15 may be oxidized. The oxidation may comprise exposing material 15 to a dry or wet oxygen containing atmosphere or plasma at an elevated temperature. For example, when the third sacrificial material 15 is polysilicon, the third sacrificial material 15 may be fully oxidized to convert it to silicon oxide 15a portions. Alternatively, material 15 portions may be partially oxidized on its surface to form a surface oxide 15a portions on the polysilicon 15. The oxidation step forms silicon nitride 9/silicon oxide 15a rings around the opening 81.

When the charge storage layer 9 is made of silicon nitride, the exposed portions of the silicon nitride layer 9 are oxidized to form silicon oxynitride 29 portions in the recesses 62 during the oxidation step. Thereafter, the silicon oxide 15a portions are removed by selective etching or anisotropic etching to expose the silicon nitride segments 9a, 9b. The silicon oxynitride 29 portions are then selectively removed by selective etching, such as by using HF:$NH_4F$:$H_2O$ wet etching medium which etches silicon oxynitride 29 much faster than silicon nitride 9. The process then proceeds in the same manner as described above and as shown in FIGS. 5I-5J.

Figure 7B:
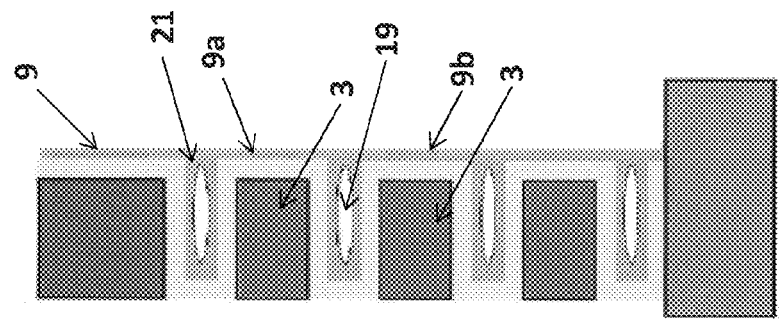
Figure 7A:
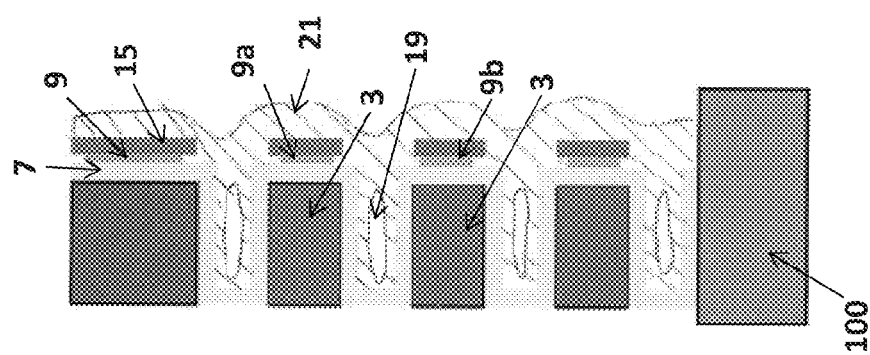

In an alternative third embodiment illustrated in FIGS. 7A and 7B, the air gaps 19 and the tunnel dielectric 11 are formed in separate steps rather than in the single step described above with respect to FIG. 5I. After the sacrificial compound material 17 is removed as described above with respect to FIG. 5G, an insulating spacer material 21 is formed in the opening 81 prior to removing the third sacrificial material regions 15. The spacer material 21 is formed over the third sacrificial material regions 15 and in the recesses 62 to partially fill the spaces in the recesses. This leaves the air gaps 19 as shown in FIG. 7A. The spacer material 21 may comprise silicon oxide or another insulating material. Preferably, material 21 is the same as the tunnel dielectric 11 material.

Thereafter, the third sacrificial material regions 15 and the spacer material 21 are removed from the opening 81. The removal may take place by a highly anisotropic etch or by lifting off the third sacrificial material regions 15. This leaves the recesses 62 partially filled with the spacer material 21 having the air gaps 19, as shown in FIG. 7B. Thereafter, the tunnel dielectric 11 is formed on the exposed charge storage segments 9a, 9b separated by the spacer material 21 which partially fills the recesses 62, as described above with respect to FIG. 5J. The channel 1 is then formed in the opening 81 over the tunnel dielectric 11 as described above.

FIGS. 8A-8G illustrate another alternative embodiment of a vertical NAND with a charge storage region (i.e., charge trapping layer or layer segments described above) containing electrically conductive nanoparticles (also known as nanocrystals or nanodots) embedded in a charge storage dielectric (e.g., electrically insulating) matrix. The nanoparticles may comprise metal silicide nanoparticles, such as nickel silicide nanoparticles, and the charge storage dielectric matrix may comprise a silicon nitride layer or segments.

Figure 8A:
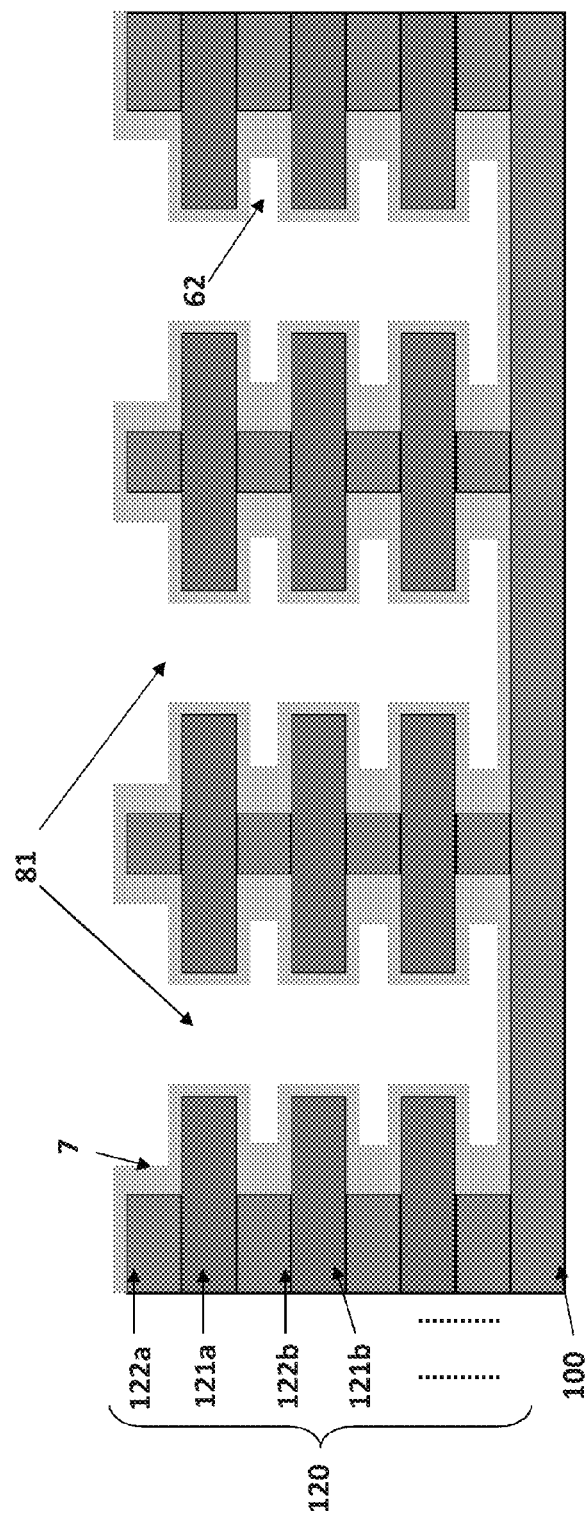

The initial process steps may be the same as the steps shown in FIGS. 5A and 5B and described above. FIG. 8A illustrates an in-process device at the same stage as FIG. 5B. The in-process device in FIG. 8A shows several openings 81 located throughout the device. The blocking dielectric 7 is located in the openings 81, partially filling the recesses 62.

Figure 8B:
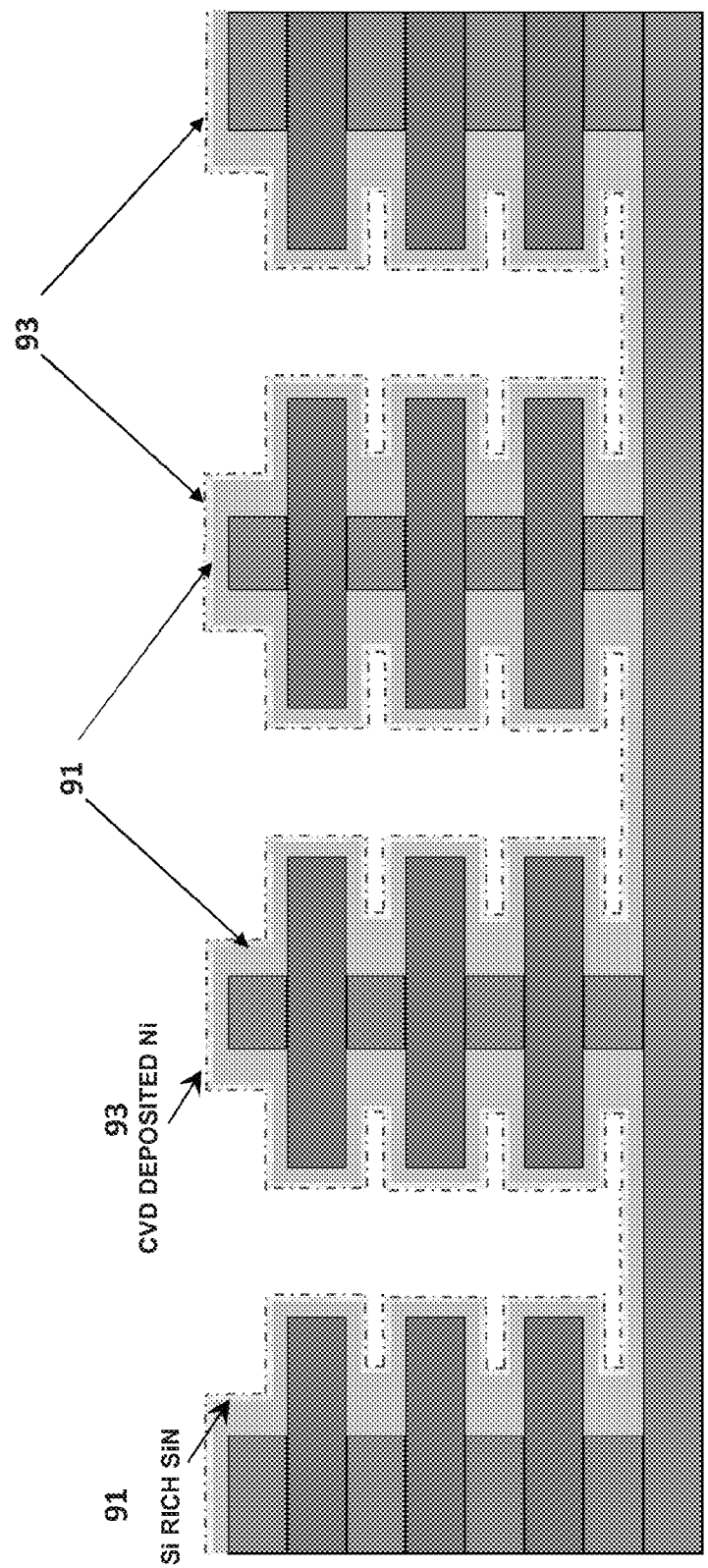

Next, as shown in FIG. 8B, a silicon nitride containing layer 91 is formed over the blocking dielectric 7 in the openings 81. In one embodiment, layer 91 may comprise a silicon-rich silicon nitride layer. The silicon-rich silicon nitride layer 91 has more than 3 silicon atoms for each 4 nitrogen atoms (e.g., $Si_3N_{4-x}$, where $0.1<x<0.75$). Layer 91 may have a thickness of 1-2 nm. Alternatively, layer 91 may be formed from plural sublayers. For example, a thin (e.g., about 1 nm) stoichiometric $Si_3N_4$ sublayer may be formed in the openings 81 instead of the silicon-rich silicon nitride layer, followed by formation of a thin (e.g., about 1 nm) sublayer of silicon on the stoichiometric silicon nitride layer. This forms layer 91 with two sublayers, with the silicon sublayer being exposed in the openings 81.

Then, an ultra thin layer of a silicide forming metal 93 is formed in the openings 81 on layer 91 by CVD, evaporation or another suitable method. Layer 93 may comprise nickel or another metal, such as cobalt, titanium, tantalum, tungsten, molybdenum, palladium, platinum, etc., which can form a silicide by reaction with silicon. Metal layer 93 thickness is preferably less than 1 nm, such as 0.2-0.5 nm. Such thin layers are usually formed as a discontinuous chain of metal islands.

Next, as shown in FIG. 8C, layers 91 and 93 are annealed to react the metal layer 93 with the silicon in layer 91 to form metal silicide nanoparticles 95 on the silicon nitride layer 91. For example, layers 91 and 93 may be annealed at 600-950 C, such as 600-700 C for a sufficient time for the Ni layer 93 to react with the excess silicon in the silicon-rich silicon nitride layer 91 to form nickel silicide nanoparticles 95 located on layer 91. Furnace annealing or rapid thermal annealing may be used.

If metals other than nickel are used, such as cobalt, titanium, tantalum, tungsten, molybdenum, palladium, or platinum, then the nanoparticles 95 comprise silicides of cobalt, titanium, tantalum, tungsten, molybdenum, palladium, or platinum, rather than nickel silicide. An optional wet-clean (e.g., wet etch) may be added to remove unreacted Ni if all Ni in layer 93 is not consumed in forming the silicide nanoparticles 95. Optionally, one or more additional anneals (e.g., furnace or rapid thermal anneals) may be added so that the nickel silicide nanoparticle islands become well rounded nanocrystals (e.g., single crystal or polycrystalline nanodots) and a desirable $NiSi_2$ phase of nickel silicide is achieved. The nanocrystals may have a diameter of 10 nm or less, such as 5 nm or less, such as 0.2 to 2 nm.

Figure 8D:
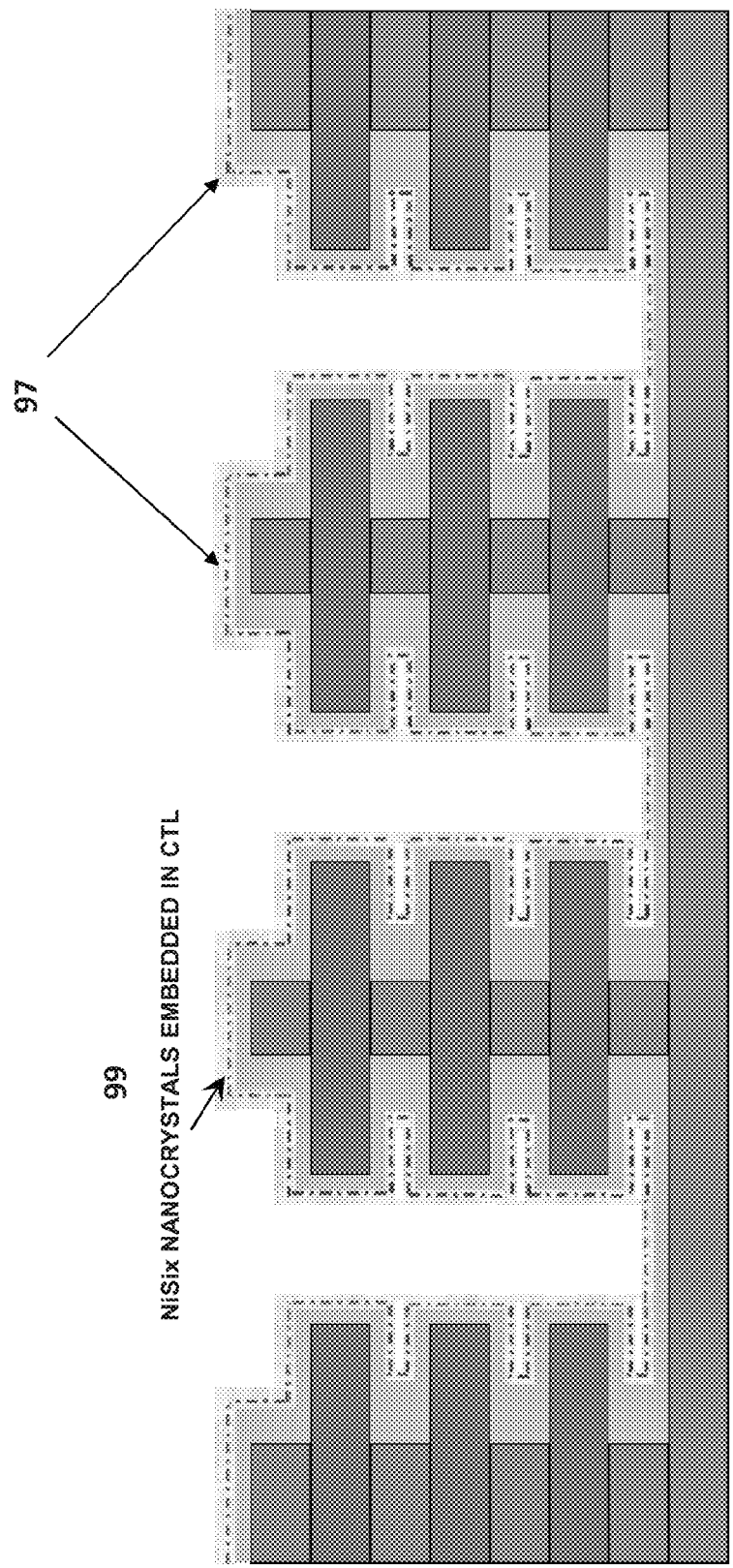

After nickel silicide nanoparticle formation, a thin layer (1-2 nm thick) of silicon nitride 97 is deposited over the nanoparticles 95 so that the silicide nanoparticles 95 are embedded (e.g., completely embedded) within silicon nitride matrix, as shown in FIG. 8D. In other words, the silicide nanoparticles 95 are embedded between silicon nitride layers 91 and 97 forming the matrix. This forms a composite charge storage film 99 (also referred to as a charge trapping layer or film) composed of silicon nitride 91/silicide nanoparticles 95/silicon nitride 97. The nickel silicide nanoparticles 95 are floating within the silicon nitride matrix 91, 97 of the charge storage film 99, and preferably are not in contact with adjacent blocking oxide dielectric 7 or the tunneling oxide dielectric 11. In another embodiment, layer 97 may comprise a silicon-rich silicon nitride layer in which case, the silicide nanoparticles 95 may be formed within the charge storage film 99, by thermal annealing of a sandwich structure comprising of layers 91, 93 and 97.

In some prior art references (see e.g., Yoo-Sung Jang, et. al., IEEE TRANSACTIONS ON ELECTRON DEVICES, Vol. 56, No. 12, p. 3236, December 2009), the electrically conductive nanoparticles are embedded in an electrically insulating oxide layer. This means that the nanoparticles rather than the surrounding oxide layers trap the charge. In contrast, as shown in FIG. 8D, when the nanoparticles are embedded in a charge trapping dielectric matrix, such as silicon nitride, then both the nanoparticles 95 and the dielectric matrix 91, 97 can be used to trap charge in film 99. The vertical NAND cell with composite film 99 may exhibit better reliability and charge trapping performance than a comparable cell with a single silicon nitride charge storage layer 9.

After the step shown in FIG. 8D, the process can proceed as shown in FIGS. 5C-5J, 6 and/or 7A-7B, and as described above. In other words, the composite silicon nitride/silicide/silicon nitride charge storage film 99 may be used instead of the single silicon nitride charge storage layer 9 shown in FIG. 5C and then patterned into composite charge storage segments as shown in FIG. 5H.

Figure 8E:
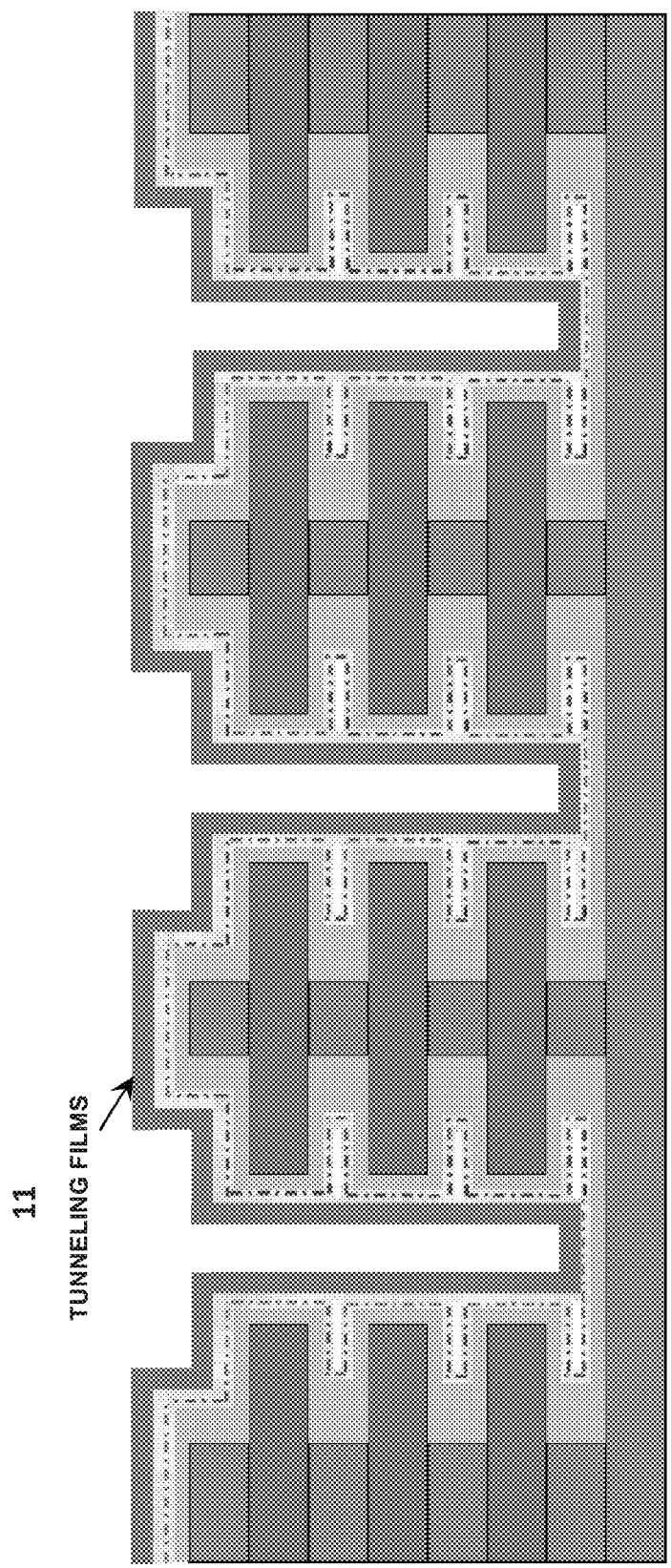
Figure 8F:
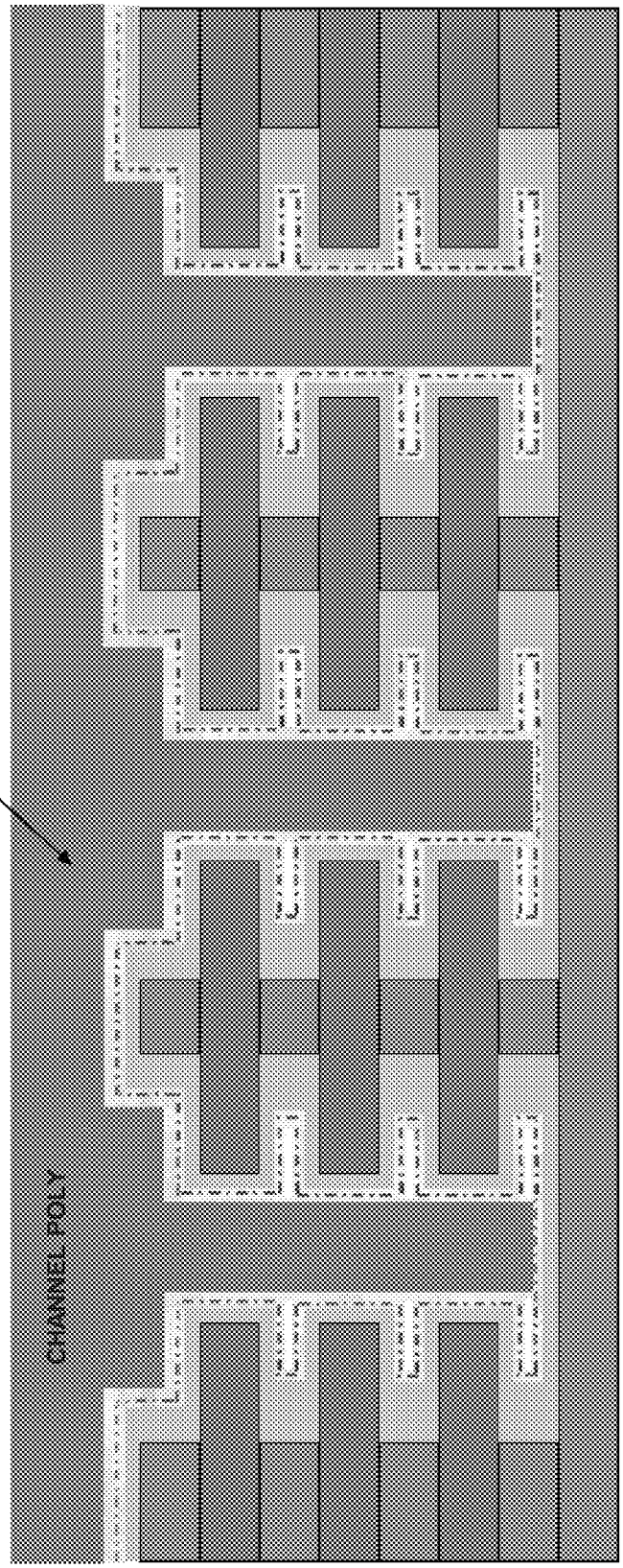
Figure 8G:
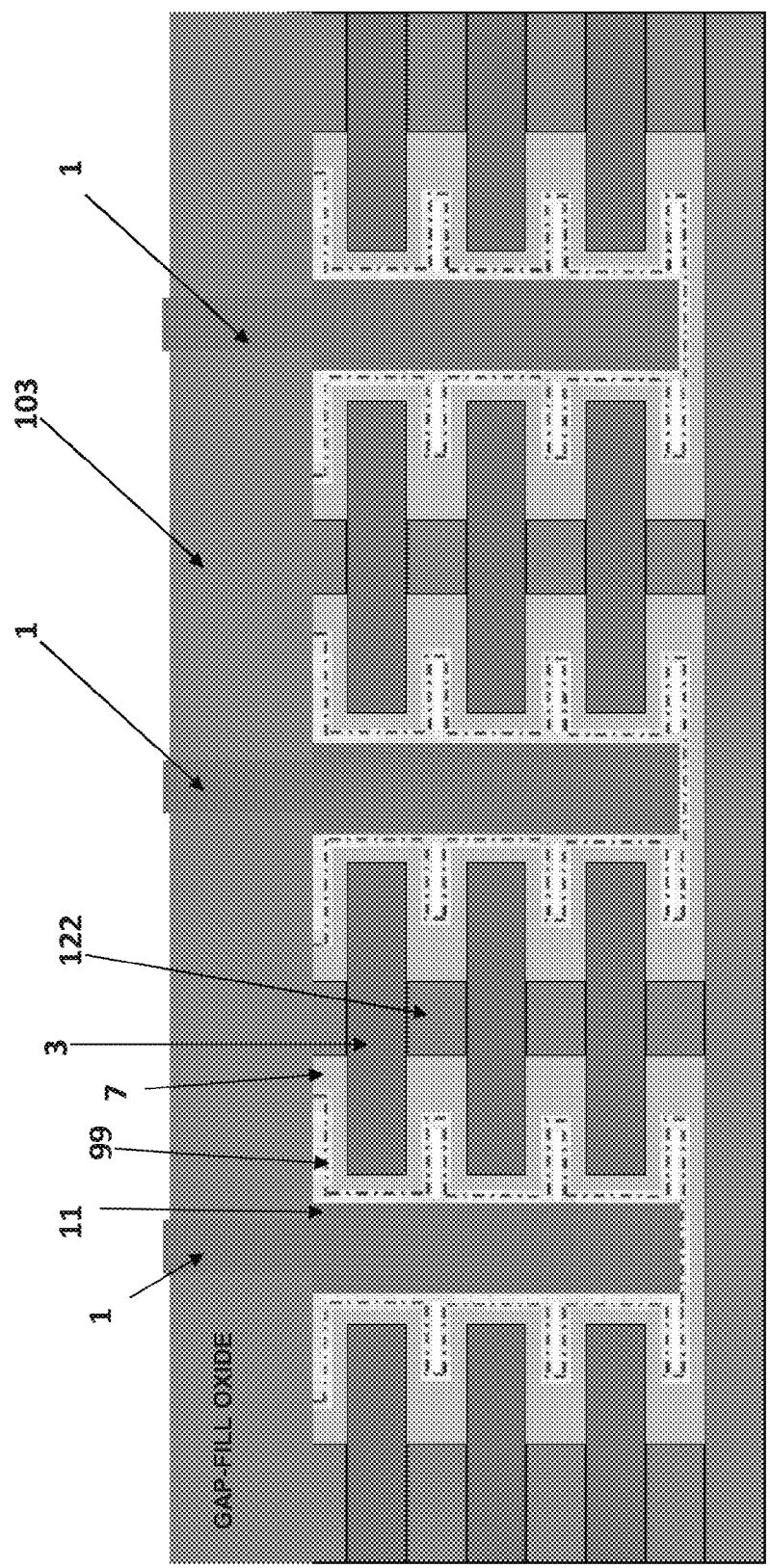

Alternatively, the use of the second and third sacrificial materials 13, 15 and the sacrificial compound material 17 shown in FIGS. 5D-5F may be omitted. Instead, the process after the formation of film 99 may proceed as shown in FIGS. 8E-8G and as described below. In this embodiment, the charge storage region of the vertical NAND string comprises the continuous composite film 99 (e.g., silicide nanoparticles in the charge storage dielectric matrix) instead of discrete segments shown in FIG. 5H.

As shown in FIG. 8E, the recesses 62 may be pinched-off (i.e., filled) by the silicon nitride layer 97 during deposition of layer 97 or the recesses 62 may be left partially unfilled. After formation of layer 97, the tunnel dielectric 11 is deposited into the openings 81 in contact with the composite charge storage film 99. The tunnel dielectric 11 may comprise a silicon oxide layer or an ONO film having any suitable thickness, such as 4-15 nm. If the recesses 62 are completely filled with layer 97, then the tunnel dielectric 11 may have substantially straight sidewalls. If the recesses 62 are not completely filled with layer 97, then the tunnel dielectric 11 may completely fill the recesses 62 or partially fill the recesses 62 to leave the air gaps 19 in the recesses (as shown in FIG. 5I or 7A).

Next, as shown in FIG. 8F, a channel semiconductor layer 101 is deposited over the device to fill the openings 81. Layer 101 may be lightly doped n-type or p-type polysilicon or another material, as described above.

Finally, as shown in FIG. 8G, layer 101 is etched back from the top to form the pillar shaped (or U-shaped) channels 1 in the openings 81. The space between the channels 1 is filled with a gap fill insulating layer 103, such as silicon oxide or another material. Layer 103 may be formed by depositing an oxide layer over the channels followed by etch back or chemical mechanical polishing to form a planar top surface exposing the top surfaces of the channels 1. The channels are then connected to source and drain electrodes as shown in FIGS. 1-4, the select gate electrodes (not shown for clarity) are connected to select gate contacts and the control gate electrodes 3 are connected to word line contacts as known in the art.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional memory device comprising:
    a semiconductor channel, at least one end portion of the semiconductor channel extending substantially perpendicular to a major surface of a substrate;
    a plurality of control gate electrodes comprising at least a first control gate electrode located in a first device level and a second control gate electrode located in a second device level located below the first device level and vertically spaced from the first control gate electrode by an air gap located substantially between the major surfaces of the first and second control gate electrodes; and
    a charge storage region comprising metal silicide nanoparticles embedded in a charge storage dielectric matrix.

2. The monolithic three-dimensional memory device of claim 1, further comprising a blocking dielectric layer located in contact with the plurality of control gate electrodes.

3. The monolithic three-dimensional memory device of claim 1, wherein the charge storage region comprises a plurality of spaced apart charge storage segments.

4. The monolithic three-dimensional memory device of claim 3, wherein the plurality of spaced apart charge storage segments comprise at least a first spaced apart charge storage segment located in the first device level and a second spaced apart charge storage segment located in the second device level.

5. The monolithic three-dimensional memory device of claim 1, wherein the charge storage region comprises a continuous composite film.

6. The monolithic three-dimensional memory device of claim 1, wherein the metal silicide nanoparticles comprise nickel silicide and the charge storage dielectric matrix comprises silicon nitride.

7. The monolithic three-dimensional memory device of claim 1, wherein each of the plurality of control gate electrodes has a strip shape with major surfaces extending substantially parallel to the major surface of the substrate.

8. The monolithic three-dimensional memory device of claim 1, further comprising a tunnel dielectric layer located between the charge storage region and the semiconductor channel.

9. The monolithic three-dimensional memory device of claim 1, wherein the semiconductor channel has a pillar shape.

10. The monolithic three-dimensional memory device of claim 9, wherein the entire pillar-shaped semiconductor channel extends substantially perpendicularly to the major surface of the substrate.

11. The monolithic three-dimensional memory device of claim 10, further comprising one of a source or drain electrode which contacts the pillar-shaped semiconductor channel from above, and another one of a source or drain electrode which contacts the pillar-shaped semiconductor channel from below.

12. The monolithic three-dimensional memory device of claim 1, wherein:
    the semiconductor channel has a U-shaped side cross section;
    two wing portions of the U-shaped semiconductor channel extend substantially perpendicular to a major surface of the substrate are connected by a connecting portion which extends substantially parallel to the major surface of the substrate; and
    an insulating fill is located over the connecting portion and separating two wing portions of the U-shaped semiconductor channel.

13. The monolithic three-dimensional memory device of claim 12, further comprising one of a source or drain electrode which contacts the first wing portion of the semiconductor channel from above, another one of a source or drain electrode which contacts the second wing portion of the semiconductor channel from above, and a body contact electrode which contacts the connecting portion of the semiconductor channel from below.

14. The monolithic three-dimensional memory device of claim 1, wherein:
    at least a portion of the blocking dielectric layer has a clam shape which surrounds a respective control gate electrode; and
    the charge storage dielectric matrix comprises a silicon nitride matrix.

15. The monolithic three-dimensional memory device of claim 1, wherein the air gap is surrounded by an insulating layer which is located between the tunnel dielectric layer and the blocking dielectric layer.

16. The monolithic three-dimensional memory device of claim 1, wherein the semiconductor channel, the plurality of control gate electrodes, and the charge storage region collectively constitute a vertically oriented NAND strings in which at least one memory cell in a first device level of the array is located over another memory cell in a second device level, and wherein the substrate comprises a silicon substrate.

17. The monolithic three-dimensional memory device of claim 16, further comprising an integrated circuit containing a driver circuit for the vertically oriented NAND strings located on the silicon substrate.

18. The monolithic three-dimensional memory device of claim 1, wherein the charge storage region comprises a plurality of vertically spaced apart floating gates or a plurality of vertically spaced apart dielectric charge storage segments.

19. The monolithic three-dimensional memory device of claim 1, wherein the air gap is surrounded by an insulating layer which is located between the tunnel dielectric layer and the blocking dielectric layer.

20. The monolithic three-dimensional memory device of claim 1, wherein the metal silicide nanoparticles comprise a material selected from nickel silicide, cobalt silicide, tantalum silicide, tungsten silicide, molybdenum silicide, palladium silicide, platinum silicide, or an alloy thereof.

* * * * *